United States Patent
Zhang et al.

(10) Patent No.: US 9,933,585 B2
(45) Date of Patent: Apr. 3, 2018

(54) LOW RETURN LOSS SILICON PHOTONICS PACKAGE STRUCTURE

(71) Applicant: SiFotonics Technologies Co., Ltd., Grand Cayman (KY)

(72) Inventors: Ning Zhang, Beijing (CN); Tuo Shi, Beijing (CN); Yongbo Shao, Beijing (CN); Tzung-I Su, Zhongli (TW); Dong Pan, Andover, MA (US)

(73) Assignee: SIFOTONICS TECHNOLOGIES CO., LTD., Grand Cayman (KY)

( * ) Notice: Subject to any disclaimer, the term of this patent is extended or adjusted under 35 U.S.C. 154(b) by 0 days.

(21) Appl. No.: 15/417,342

(22) Filed: Jan. 27, 2017

(65) Prior Publication Data

US 2017/0219783 A1   Aug. 3, 2017

(30) Foreign Application Priority Data

Feb. 1, 2016   (CN) .................. 2016 1 0069865.2

(51) Int. Cl.
| | |
|---|---|
| *G02B 6/42* | (2006.01) |
| *G02B 6/27* | (2006.01) |
| *G02B 6/30* | (2006.01) |
| *H01S 5/022* | (2006.01) |
| *H01S 5/00* | (2006.01) |
| *H01S 5/12* | (2006.01) |

(52) U.S. Cl.
CPC ......... *G02B 6/4206* (2013.01); *G02B 6/2746* (2013.01); *G02B 6/30* (2013.01); *G02B 6/4208* (2013.01); *G02B 6/4212* (2013.01); *G02B 6/4257* (2013.01); *G02B 6/4262* (2013.01); *H01S 5/0064* (2013.01); *H01S 5/0228* (2013.01); *H01S 5/02284* (2013.01); *H01S 5/005* (2013.01); *H01S 5/02248* (2013.01); *H01S 5/12* (2013.01)

(58) Field of Classification Search
CPC ...... G02B 6/2746; G02B 6/30; G02B 6/4206; G02B 6/4208; G02B 6/4212; G02B 6/4257; G02B 6/4262; H01S 5/0228
See application file for complete search history.

(56) References Cited

U.S. PATENT DOCUMENTS

| | | | | |
|---|---|---|---|---|
| 7,263,247 B1 * | 8/2007 | Hehlen | ................... | G02B 6/126 385/14 |
| 7,539,370 B2 * | 5/2009 | Yamazaki | ................ | G02B 6/30 385/14 |

(Continued)

*Primary Examiner* — Daniel Petkovsek
(74) *Attorney, Agent, or Firm* — Han IP Corporated

(57) ABSTRACT

A compact and highly efficient coupling structure for coupling between DFB-LD and Si PIC edge coupler with suppressed return loss may include a DFB-LD, a Si PIC comprising at least one input edge coupler and at least one output edge coupler, a silica cover lid disposed on the Si PIC and aligned edge to edge with the Si PIC, a single-mode fiber aligned to the at least one output edge coupler of the Si PIC, a lens disposed between the DFB-LD and the at least one input edge coupler of the Si PIC, and an isolator bonded to a facet of the at least one input edge coupler with a first volume of an index matching fluid. The lens may be configured to minimize a mismatch between an output spot size of the DFB-LD and a spot size of the at least one input edge coupler of the Si PIC.

19 Claims, 5 Drawing Sheets

(56) References Cited

U.S. PATENT DOCUMENTS

| | | | | |
|---|---|---|---|---|
| 8,295,320 B2* | 10/2012 | Alalusi | ............ | H01S 5/141 372/92 |
| 8,326,100 B2* | 12/2012 | Chen | ............ | G02B 6/1228 385/14 |
| 9,400,359 B1* | 7/2016 | Fu | ............ | G02B 6/4244 |
| 2010/0208756 A1* | 8/2010 | Noh | ............ | G02B 6/4206 372/20 |
| 2016/0329680 A1* | 11/2016 | Shi | ............ | H01S 5/02284 |

* cited by examiner

LOW RETURN LOSS SILICON PHOTONICS PACKAGE STRUCTURE

CROSS-REFERENCE TO RELATED PATENT APPLICATION(S)

The present disclosure claims the priority benefit of, China Patent Application for Invention No. 2016100698652, filed on 1 Feb. 2016, which is herein incorporated by reference in its entirety.

TECHNICAL FIELD

The present disclosure is related to optical packages. More particularly, the present disclosure is directed to an optical package structure of silicon photonics with edge coupler for distributed feedback (DFB) laser package with low return loss.

BACKGROUND

Silicon photonic integrated circuits (Si PIC) have been awarded with tremendous attention due to their high density integration capabilities of coupler, modulator, photodiode, avalanche photodiode, polarization diversity components and multimode interferometers. However, link budget deficiency has limited the application of Si PIC. In one aspect, the coupling efficiency of distributed feedback lasers (DFB-LD) and Si PIC has major influence on the link budget.

Up to present time, there are two coupler structures adopted in Si PICs. The first coupler structure is grating coupler, which is favored for its on-chip characterizing compatibilities and high coupling efficiency with less than 2 dB insertion loss. However, one disadvantage of grating coupler is its limited spectral bandwidth, and the typical bandwidth within 1 dB variation is less than 20 nm. Another unobvious but significant disadvantage is that its vertical packaging structure cannot be easily designed into QSFP28 form factors which have already been the main stream packaging form factor in data center applications.

The second coupler structure is edge coupler, usually with an inverse tapered silicon waveguide surrounded by a $SiO_2$ cantilever structure. Edge couplers are in-plane structures which can be fully compatible with QSFP form factors. Edge couplers could also provide less than 2 dB insertion loss to single mode fiber, as well as demonstrating coupling tolerance comparable with single mode fiber and very wide spectral bandwidth supporting O-band and C-band simultaneously. Nevertheless, so far, the coupling loss of a DFB LD is still beyond acceptable, due to the mismatch of DFB-LD mode size and edge coupler mode size. Lenses have been adopted to overcome the mismatch between two modes, as shown in the conventional coupling scheme 500 in FIG. 5, but the reflection from the edge coupler facet has impact on the DFB laser.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present disclosure aims to address aforementioned issues associated with conventional coupling structures. Advantageously, the present disclosure provides a novel compact and highly efficient coupling structure for coupling between DFB-LD and Si PIC edge coupler with suppressed return loss.

In one aspect, a compact and highly efficient coupling structure for coupling between DFB-LD and Si PIC edge coupler with suppressed return loss may include a DFB-LD, a Si PIC comprising at least one input edge coupler and at least one output edge coupler, a silica cover lid disposed on the Si PIC and aligned edge to edge with the Si PIC, a single-mode fiber aligned to the at least one output edge coupler of the Si PIC, a lens disposed between the DFB-LD and the at least one input edge coupler of the Si PIC, and an isolator bonded to a facet of the at least one input edge coupler with a first volume of an index matching fluid. The lens may be configured to minimize a mismatch between an output spot size of the DFB-LD and a spot size of the at least one input edge coupler of the Si PIC.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Detailed embodiments of the claimed subject matters are disclosed herein. However, it shall be understood that the disclosed embodiments are merely illustrative of the claimed subject matters which may be embodied in various forms. The present disclosure may, however, be embodied in many different forms and should not be construed as limited to the exemplary embodiments set forth herein. Rather, these exemplary embodiments are provided so that description of the present disclosure is thorough and complete and will fully convey the scope of the present disclosure to those skilled in the art. In the description below, details of well-known features and techniques may be omitted to avoid unnecessarily obscuring the presented embodiments.

Figure 1:
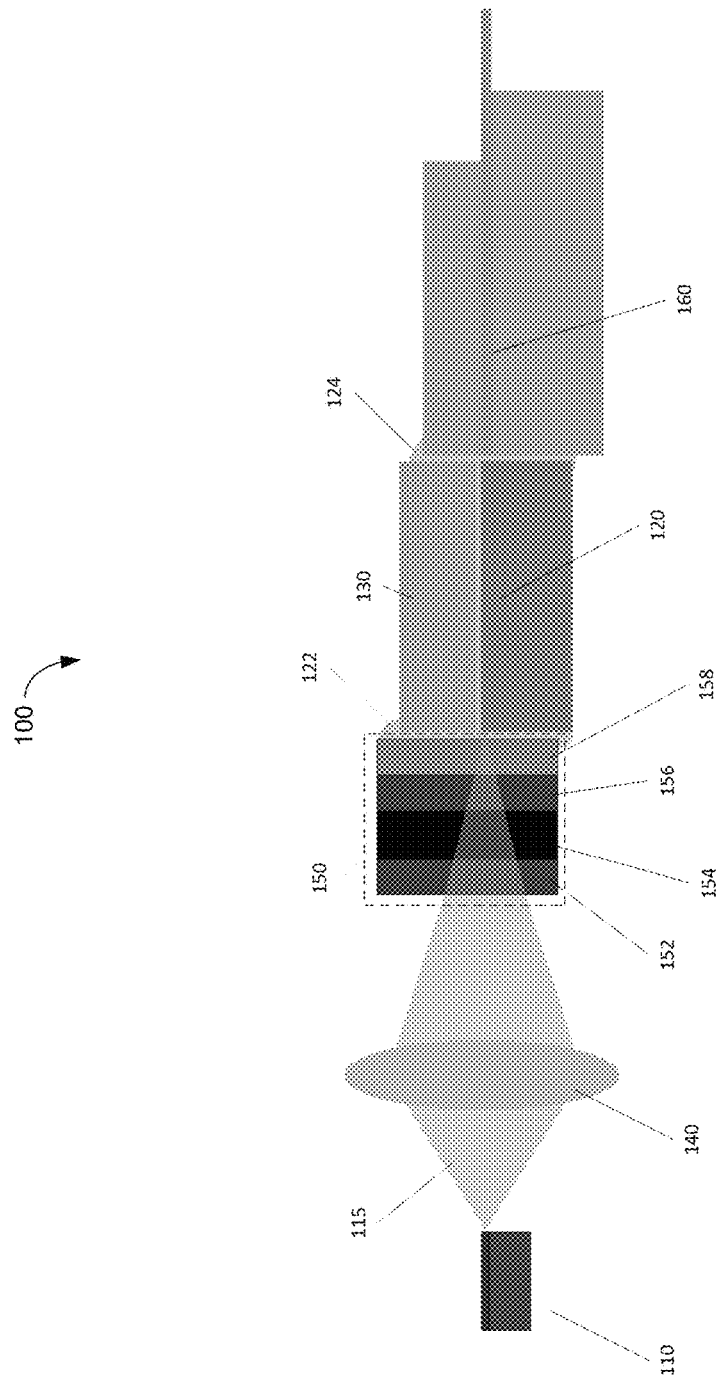
FIG. 1 is a diagram of a high-efficiency coupling structure in accordance with an embodiment of the present disclosure.

FIG. 1 illustrates a high-efficiency coupling structure 100 in accordance with an embodiment of the present disclosure. The present disclosure provides a novel compact and high-efficiency coupling structure 100 for coupling between a DFB-LD and a Si PIC edge coupler with suppressed return loss. Referring to FIG. 1, the high-efficiency coupling structure 100 may include a DFB-LD 110, a Si PIC 120 with a silica cover lid 130, a lens 140 inserted between DFB-LD 110 and an input edge coupler (not shown) of Si PIC 120, an isolator 150 attached to an input facet end of Si PIC 120 with certain amount of an index matching fluid (IMF) 122 filling an air gap, and a single-mode fiber 160 coupled to an output edge coupler of Si PIC 120 with certain amount of an index matching fluid 124 filling an air gap. Isolator 150 may include a 0°-polarizer 152, a Faraday rotator 154, a 45°-polarizer 156, and a wave plate 158. Isolator 150 may be capable of rotating a polarization back to an input polarization direction. Furthermore, an input surface of isolator 150, which is disposed toward lens 140, may be coated with an anti-reflection film (not shown) to reduce return loss. In some embodiments, each of the index matching fluid 122 and the index matching fluid 124 may be ultraviolet (UV) cured.

In some embodiments, wave plate 158 may be aligned to rotate a polarization of an output beam 115 of DFB-LD 110 to a polarization state of DFB-LD 110. In some embodiments, isolator 150 may be bonded to the at least one input edge coupler of Si PIC 120 with a tilt angle. In some embodiments, the at least one input edge coupler may include a cantilever structure edge coupler, an anchored-cantilever structure edge coupler, or a combination thereof. In some embodiments, the lens may include a ball lens, an aspheric lens, a gradient index (GRIN) lens, a set of collimator lenses, or a combination thereof. In some embodiments, single-mode fiber 160 may be fixed to a facet of the at least one output edge coupler with an UV-curable index matching fluid. In some embodiments, single-mode fiber 160 may include a fiber array assembly. In some embodiments, DFB-LD 110 may be capable of operating at a wavelength range of C-band, O-band, or a combination thereof. In some embodiments, DFB-LD 110 and lens 140 may be packaged as one packaged component. In some embodiments, the packaged component may be of a transistor outline can (TO-can) type or a butterfly type.

Figure 2:
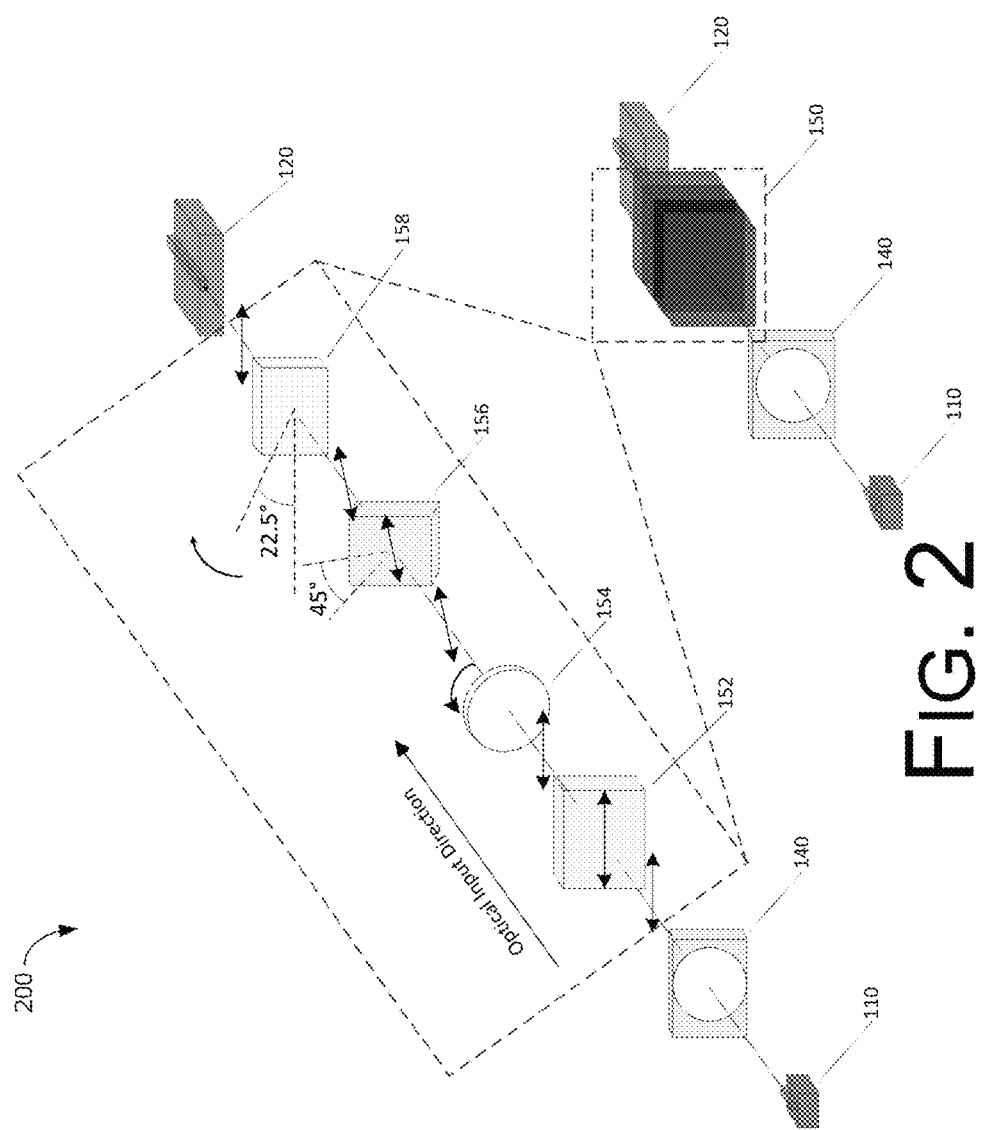
FIG. 2 is a diagram of an isolator in accordance with an embodiment of the present disclosure.

FIG. 2 illustrates an isolator 200 in accordance with an embodiment of the present disclosure. Isolator 200 may be an example implementation of isolator 150 of coupling structure 100.

Figure 3:
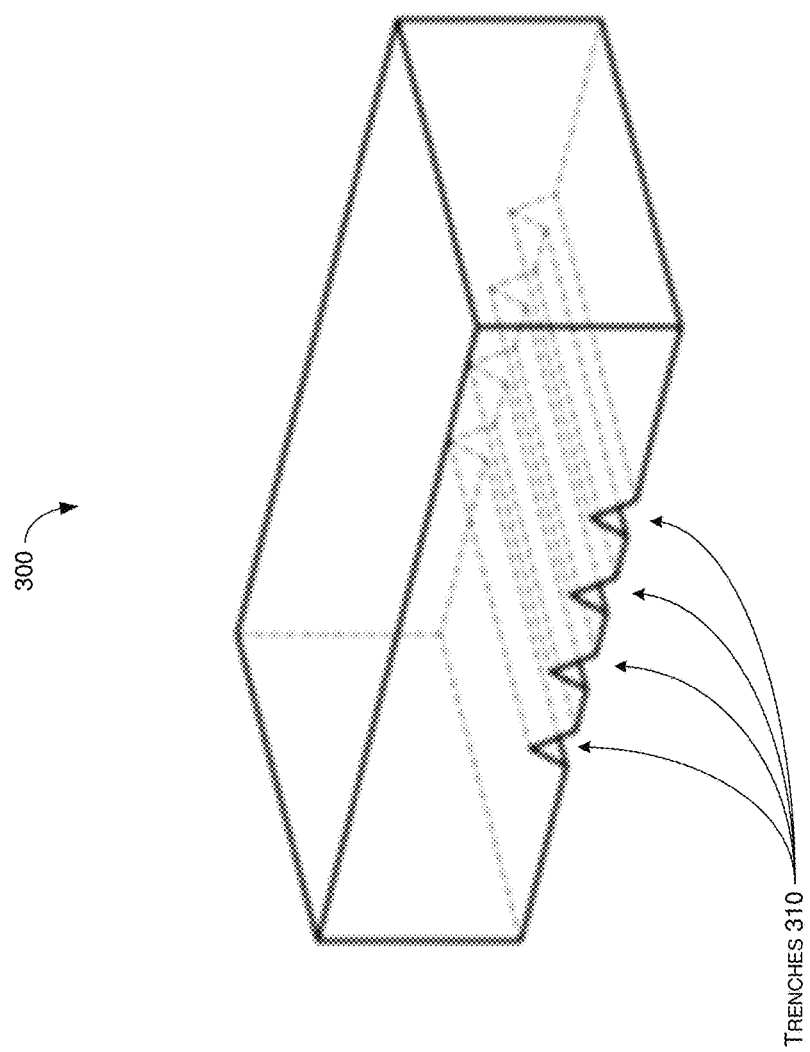
FIG. 3 is a diagram of a silica cover lid in accordance with an embodiment of the present disclosure.

FIG. 3 illustrates a silica cover lid 300 in accordance with an embodiment of the present disclosure. Silica cover lid 300 may be an example implementation of silica cover lid 130 of coupling structure 100. In the example shown in FIG. 3, silica cover lid 300 may include a number of trenches 310 on one of its surfaces. Trenches 310 may be configured to accommodate filling by a certain volume of an index matching fluid. In some embodiments, trenches 310 may be aligned to the at least one input edge coupler and the at least one output edge coupler of Si PIC 120.

Figure 4:
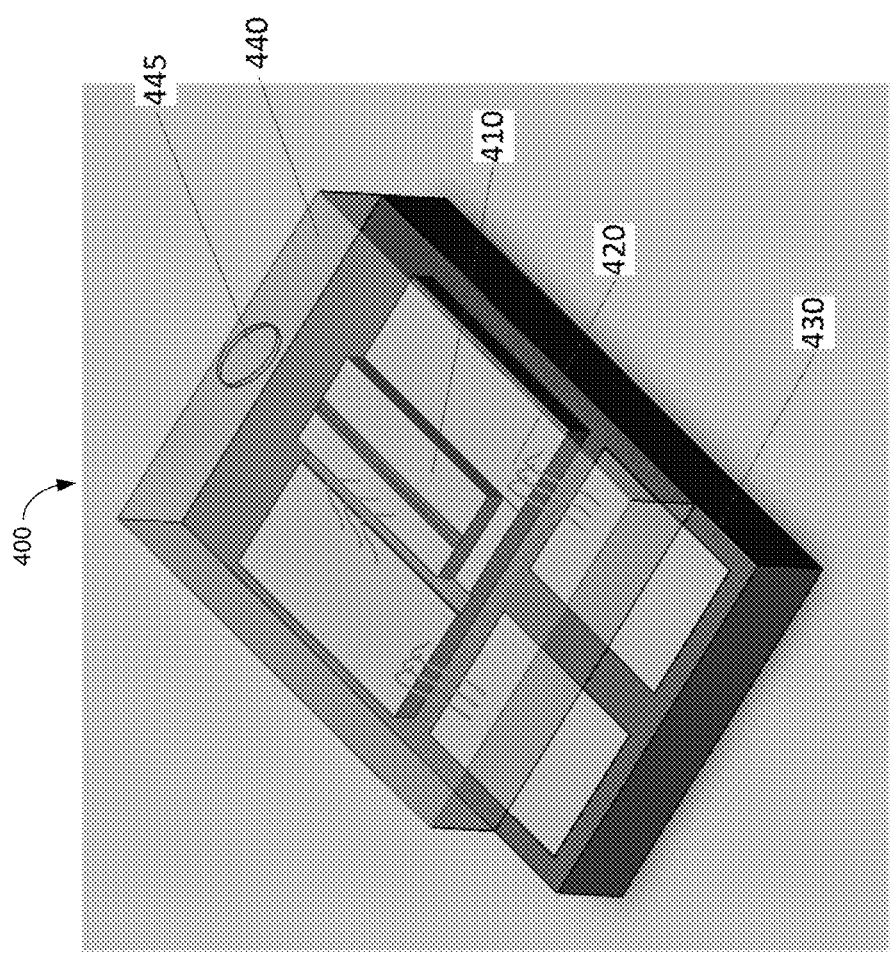
FIG. 4 is a diagram of a semi-hermetic package box for DFB-LD package in accordance with an embodiment of the present disclosure.
Figure 5:
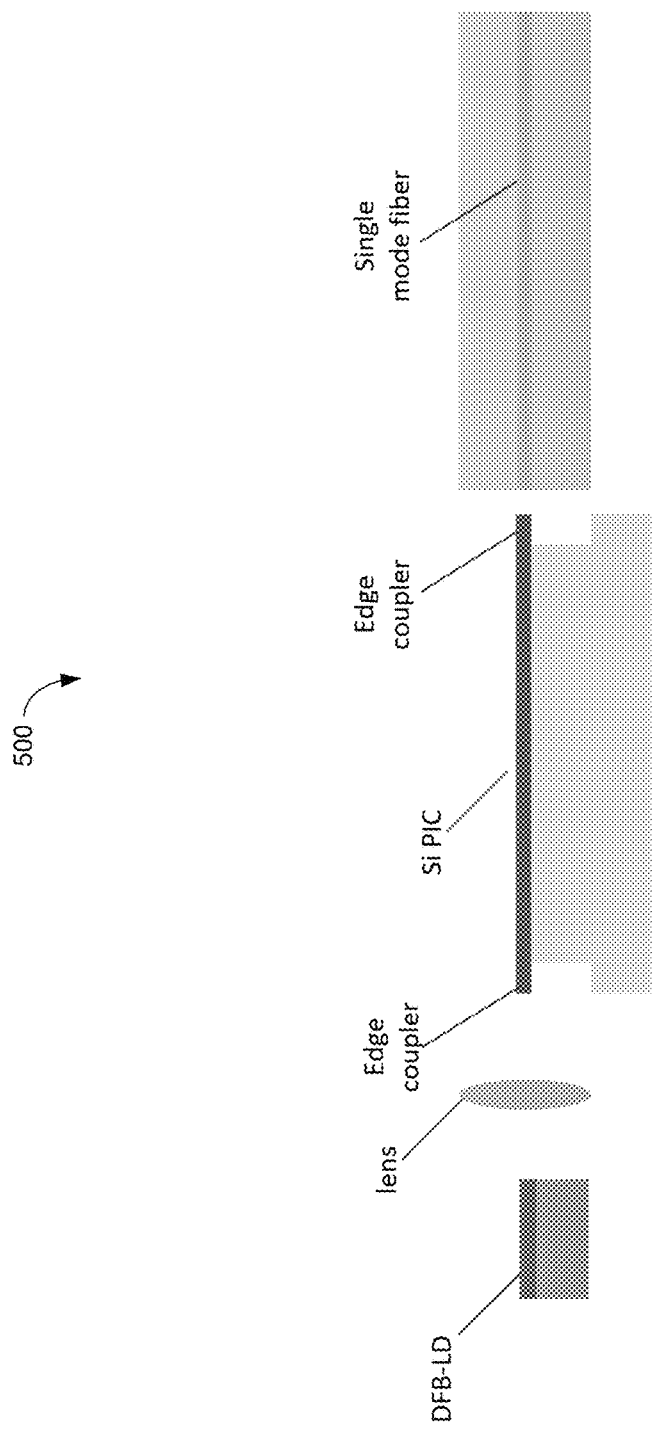
FIG. 5 is a diagram of a conventional coupling scheme in the prior art.

FIG. 4 illustrates a semi-hermetic package box 400 for DFB-LD package in accordance with an embodiment of the present disclosure. The semi-hermetic package box 400 may include a DFB-LD chip 410, a first substrate 420 on which DFB-LD chip 410 is mounted, a second substrate 430 on which first substrate 420 is mounted, and a sealing cap 440. Sealing cap 440 may include a lens 445 embedded in a front fact of sealing cap 440 along a beam propagation direction of a beam outputted by DFB-LD chip 410 (e.g., optical beam 115 shown in FIG. 1).

In some embodiments, DFB-LD chip 410 may be eutectic bonded to first substrate 420. In some embodiments, first substrate 420 may be a ceramic substrate. In some embodiments, a material of first substrate 420 may include silicon, $Al_2O_3$, AlN, or a combination thereof. In some embodiments, a material of second substrate 430 may include silicon, $Al_2O_3$, AlN, or a combination thereof. In some embodiments, sealing cap 440 may be mounted on second substrate 430 and sealed with UV-curable epoxy or silver paste. In some embodiments, a material of sealing cap 440 may include silica, silicon, epoxy, or a combination thereof.

In view of the above, select features of various embodiments in accordance with the present disclosure are described below.

In one aspect, a compact and highly efficient coupling structure for coupling between DFB-LD and Si PIC edge coupler with suppressed return loss may include a DFB-LD, a Si PIC comprising at least one input edge coupler and at least one output edge coupler, a silica cover lid disposed on the Si PIC and aligned edge to edge with the Si PIC, a single-mode fiber aligned to the at least one output edge coupler of the Si PIC, a lens disposed between the DFB-LD and the at least one input edge coupler of the Si PIC, and an isolator bonded to a facet of the at least one input edge coupler with a first volume of an index matching fluid. The lens may be configured to minimize a mismatch between an output spot size of the DFB-LD and a spot size of the at least one input edge coupler of the Si PIC.

In some embodiments, the isolator may include a 0°-polarizer, a Faraday rotator, a 45°-polarizer, and a wave plate.

In some embodiments, the wave plate may be aligned to rotate a polarization of an output beam of the DFB-LD to a polarization state of the DFB-LD.

In some embodiments, the isolator may be bonded to the at least one input edge coupler of the Si PIC with a tilt angle.

In some embodiments, a first surface of the isolator, which is disposed toward the lens, may be coated with an anti-reflection film.

In some embodiments, the at least one input edge coupler may include a cantilever structure edge coupler, an anchored-cantilever structure edge coupler, or a combination thereof.

In some embodiments, the lens may include a ball lens, an aspheric lens, a GRIN lens, a set of collimator lenses, or a combination thereof.

In some embodiments, the index matching fluid may be UV curable.

In some embodiments, the single-mode fiber may be fixed to a facet of the at least one output edge coupler with an UV-curable index matching fluid.

In some embodiments, the single-mode fiber may include a fiber array assembly.

In some embodiments, the DFB-LD may be capable of operating at a wavelength range of C-band, O-band, or a combination thereof.

In some embodiments, the silica cover lid may include a plurality of trenches configured to accommodate filling by a second volume of the index matching fluid. In some embodiments, the trenches may be aligned to the at least one input edge coupler and the at least one output edge coupler of the Si PIC.

In some embodiments, the DFB-LD and the lens may be packaged as one packaged component.

In some embodiments, the packaged component may be of a TO-can type or a butterfly type.

In some embodiments, the packaged component may include a semi-hermetic packaged box, which may include: a DFB-LD chip, a first substrate on which the DFB-LD chip is mounted, a second substrate on which the first substrate is mounted, and a sealing cap comprising a lens embedded in a front fact of the sealing cap along a beam propagation direction of a beam outputted by the DFB-LD chip.

In some embodiments, the DFB-LD chip may be eutectic bonded to the first substrate.

In some embodiments, a material of the first substrate may include silicon, $Al_2O_3$, AlN, or a combination thereof.

In some embodiments, a material of the second substrate comprises silicon, $Al_2O_3$, AlN, or a combination thereof.

In some embodiments, the sealing cap may be mounted on the second substrate and sealed with UV-curable epoxy or silver paste.

In some embodiments, a material of the sealing cap comprises silica, silicon, epoxy, or a combination thereof.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An optical package structure, comprising:
   a distributed feedback laser diode (DFB-LD);
   a silicon photonic integrated-circuit chip (Si PIC) comprising at least one input edge coupler and at least one output edge coupler;
   a silica cover lid disposed on the Si PIC and aligned edge to edge with the Si PIC;
   a single-mode fiber aligned to the at least one output edge coupler of the Si PIC;
   a lens disposed between the DFB-LD and the at least one input edge coupler of the Si PIC, the lens configured to minimize a mismatch between an output spot size of the DFB-LD and a spot size of the at least one input edge coupler of the Si PIC; and
   an isolator bonded to a facet of the at least one input edge coupler with a first volume of an index matching fluid, wherein the isolator comprises a 0°-polarizer, a Faraday rotator, a 45°-polarizer, and a wave plate.

2. The optical package structure of claim 1, wherein the wave plate is aligned to rotate a polarization of an output beam of the DFB-LD to a polarization state of the DFB-LD.

3. The optical package structure of claim 1, wherein the isolator is bonded to the at least one input edge coupler of the Si PIC with a tilt angle.

4. The optical package structure of claim 1, wherein a first surface of the isolator, which is disposed toward the lens, is coated with an anti-reflection film.

5. The optical package structure of claim 1, wherein the at least one input edge coupler comprises a cantilever structure edge coupler, an anchored-cantilever structure edge coupler, or a combination thereof.

6. The optical package structure of claim 1, wherein the lens comprises a ball lens, an aspheric lens, a gradient index (GRIN) lens, a set of collimator lenses, or a combination thereof.

7. The optical package structure of claim 1, wherein the index matching fluid is ultraviolet (UV) curable.

8. The optical package structure of claim 1, wherein the single-mode fiber is fixed to a facet of the at least one output edge coupler with an ultraviolet (UV)-curable index matching fluid.

9. The optical package structure of claim 8, wherein the single-mode fiber comprises a fiber array assembly.

10. The optical package structure of claim 1, wherein the DFB-LD is capable of operating at a wavelength range of C-band, O-band, or a combination thereof.

11. The optical package structure of claim 1, wherein the silica cover lid comprises a plurality of trenches configured to accommodate filling by a second volume of the index matching fluid, and wherein the trenches are aligned to the at least one input edge coupler and the at least one output edge coupler of the Si PIC.

12. The optical package structure of claim 1, wherein the DFB-LD and the lens are packaged as one packaged component.

13. The optical package structure of claim 12, wherein the packaged component is of a transistor outline can (TO-can) type or a butterfly type.

14. The optical package structure of claim 12, wherein the packaged component comprises a semi-hermetic packaged box comprising:
    a DFB-LD chip;
    a first substrate on which the DFB-LD chip is mounted;
    a second substrate on which the first substrate is mounted; and
    a sealing cap comprising a lens embedded in a front fact of the sealing cap along a beam propagation direction of a beam outputted by the DFB-LD chip.

15. The optical package structure of claim 14, wherein the DFB-LD chip is eutectic bonded to the first substrate.

16. The optical package structure of claim 14, wherein a material of the first substrate comprises silicon, $Al_2O_3$, AlN, or a combination thereof.

17. The optical package structure of claim 14, wherein a material of the second substrate comprises silicon, $Al_2O_3$, AlN, or a combination thereof.

18. The optical package structure of claim 14, wherein the sealing cap is mounted on the second substrate and sealed with ultraviolet (UV)-curable epoxy or silver paste.

19. The optical package structure of claim 14, wherein a material of the sealing cap comprises silica, silicon, epoxy, or a combination thereof.

* * * * *